United States Patent
Behler et al.

(10) Patent No.: US 8,133,823 B2
(45) Date of Patent: Mar. 13, 2012

(54) METHOD FOR PICKING UP SEMICONDUCTOR CHIPS FROM A WAFER TABLE AND METHOD FOR MOUNTING SEMICONDUCTOR CHIPS ON A SUBSTRATE

(75) Inventors: Stefan Behler, Steinhausen (CH); Patrick Blessing, Thalwil (CH)

(73) Assignee: Oerlikon Assembly Equipment AG, Steinhausen, Cham (CH)

( * ) Notice: Subject to any disclaimer, the term of this patent is extended or adjusted under 35 U.S.C. 154(b) by 826 days.

(21) Appl. No.: 12/247,986

(22) Filed: Oct. 8, 2008

(65) Prior Publication Data
US 2009/0098667 A1    Apr. 16, 2009

(30) Foreign Application Priority Data

Oct. 9, 2007  (CH) ..................................... 1562/07
Jul. 17, 2008  (CH) ..................................... 1136/08

(51) Int. Cl.
*H01L 21/98*    (2006.01)
(52) U.S. Cl. ................ 438/800; 257/E21.705; 356/620; 702/95
(58) Field of Classification Search .................. 356/615, 356/620, 401; 438/5, 15, 800; 702/95; 257/E21.705
See application file for complete search history.

(56) References Cited

U.S. PATENT DOCUMENTS

| | | | |
|---|---|---|---|
| 6,185,815 B1 | 2/2001 | Schindler | |
| 7,120,995 B2 | 10/2006 | Vischer | |
| 7,146,718 B2 | 12/2006 | Thuerlemann | |
| 7,275,314 B2 * | 10/2007 | Yakiyama et al. | .............. 29/832 |
| 7,415,759 B2 | 8/2008 | Vischer | |
| 2007/0145102 A1 | 6/2007 | Blessing et al. | |

FOREIGN PATENT DOCUMENTS

| | | |
|---|---|---|
| DE | 10 2004 036 990 | 3/2006 |
| EP | 1 065 917 | 1/2001 |
| EP | 1 395 106 | 3/2004 |
| EP | 1 437 933 | 7/2004 |
| EP | 1 581 040 | 9/2005 |
| WO | 2006/079617 | 8/2006 |
| WO | 2008/083701 | 7/2008 |

OTHER PUBLICATIONS

International Search Report for International Application No. PCT/EP2008/063268, mailed Jun. 29, 2009.

* cited by examiner

*Primary Examiner* — William D Coleman
*Assistant Examiner* — Daniel Shook
(74) *Attorney, Agent, or Firm* — Nixon Peabody LLP

(57) ABSTRACT

The invention relates to a method for picking up semiconductor chips from a wafer table and, optionally, their mounting on a substrate by means of a pick-and-place system. The position and orientation of the semiconductor chip to be mounted next are determined by means of a first camera and made available in the form of positional data relating to a first system of coordinates. The position and orientation of the substrate place on which the semiconductor chip will be mounted are determined by means of a second camera and made available in the form of positional data relating to a second system of coordinates. The conversion of coordinates of the first or second system of coordinates into coordinates of motion of the pick-and-place system occurs by means of two fixed mapping functions and two changeable correction vectors. The correction vectors are readjusted on the occurrence of a predetermined event.

17 Claims, 2 Drawing Sheets

METHOD FOR PICKING UP SEMICONDUCTOR CHIPS FROM A WAFER TABLE AND METHOD FOR MOUNTING SEMICONDUCTOR CHIPS ON A SUBSTRATE

PRIORITY CLAIM

Applicant hereby claims foreign priority under 35 U.S.C §119 from Swiss Application Nos. 1562/07 filed Oct. 9, 2007 and 1136/08 filed Jul. 17, 2008, the disclosures of which are herein incorporated by reference.

FIELD OF THE INVENTION

The invention relates to a method for picking up semiconductor chips provided on a wafer table. The invention further relates to a method for mounting the removed semiconductor chips on a substrate.

BACKGROUND OF THE INVENTION

Mounting machines for the mounting of semiconductor chips are known in the field as die bonders. The mounting machine is used to mount the numerous uniform chips of a wafer which are situated adjacent to one another on a chip carrier one after the other on a substrate, e.g. a metallic lead frame. The die bonder comprises a wafer table on which the chip carrier is situated, a transport system for supplying the substrate and a pick-and-place system in order to remove the semiconductor chips from the chip carrier and place them on the substrate. The pick-and-place system comprises a bonding head with a chip gripper which is moved back and forth by a drive system. The chip gripper is rotatable about a vertical axis, so that the rotational position of the semiconductor chips can be changed if necessary. The chip gripper comprises an exchangeable gripping member, which is a suction member to which vacuum may be applied, which is known in the field as a "pick-up tool" or "die collet".

Extremely high demands are placed on mounting machines of this kind. They need to be placed in a precise position on the substrate for further processing of the mounted chips. Two cameras are provided on the die bonder to ensure that the semiconductor chips can be placed on the substrate with a precision that lies in the micrometer range. The first camera measures the position of the semiconductor chip to be picked up by the chip gripper and supplies the positional data which relate to a first system of coordinates. The second camera measures the position of the substrate place on which the semiconductor chip needs to be placed and supplies positional data that relate to a second system of coordinates. The pick-and-place system controls the bonding head on the basis of the information supplied by the cameras in such a way that the chip gripper can remove the semiconductor chip from the wafer table and can place the same in a precise positional way at the correct location on the substrate place. The position of the pick-and-place system relates to a third system of coordinates which is independent of the system of coordinates of the camera.

During operation of the die bonder, the problem arises that the relative position of the three systems of coordinates may change due to different conditions. The temperature at different locations of the die bonder often changes, intentionally or unintentionally. This mostly leads to the consequence that the conversion of target coordinates which were determined in the system of coordinates of the first camera or in the system of coordinates of the second camera into motional coordinates for the pick-and-place system is no longer as exact as required.

SUMMARY OF THE INVENTION

The invention is based on the object of providing a method for picking up and mounting semiconductor chips which ensures high precision in placement, irrespective of external circumstances and changes.

The invention relates to a method for picking up and, optionally, mounting semiconductor chips on a substrate, in which
  the semiconductor chips are provided on a wafer table;
  one substrate after the other is provided on a substrate table;
  a first camera detects the position and orientation of the semiconductor chip which is provided on the wafer table and is to be mounted as the next one;
  a second camera detects the position and orientation of the substrate place on which the semiconductor chip will be mounted, and
  a chip gripper picks up the semiconductor chip provided on the wafer table and mounts the same on the substrate, with the chip gripper being held on a bonding head and a pick-and-place system with preferably two linear drives conveys the bonding head with the chip gripper back and forth between the wafer table and the substrate.

In accordance with the invention, the position of the semiconductor chip to be mounted next as detected by the first camera is provided in the form of positional data relating to a first system of coordinates $KS_1$, the position of the substrate place on which the semiconductor chip is to be mounted is provided in the form of positional data relating to a second system of coordinates $KS_2$, and the position of the bonding head is related to a third system of coordinates $KS_3$.

The invention proposes providing a marking on the bonding head whose position can be measured by the cameras. Since the marking cannot be arranged in the focal plane of the cameras for constructional reasons, the invention further proposes in a preferred embodiment to attach a lens above the marking, which lens ensures that the marking is also imaged in a sharply defined manner.

The invention further proposes to use a first fixed mapping function F and a first changeable correction vector $K_1$ for converting coordinates of the first system of coordinates $KS_1$ to the third system of coordinates $KS_3$ of the pick-and-place system, and a second fixed mapping function G and a second changeable correction vector $K_2$ for the conversion of coordinates of the second system of coordinates $KS_2$ to the third system of coordinates $KS_3$ of the pick-and-place system. When the die bonder is set up for the first time or also in the case of a general new setting of the die bonder, the mapping functions F and G and their inverse functions are determined on the one hand and the two correction vectors $K_1$ and $K_2$ are set to zero. Whereas the mapping functions F and G are not changed until the next general new setting of the die bonder, the correction vectors $K_1$ and $K_2$ are readjusted upon the occurrence of a predetermined event. A predetermined event shall be understood as being an event in which it can be expected with a high amount of probability that the relative position of the three systems of coordinates $KS_1$, $KS_2$ and $KS_3$ is changed with respect to each other to an extent that reduces placement precision.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not shown true to scale. In the drawings.

DETAILED DESCRIPTION OF THE INVENTION

Figure 1:
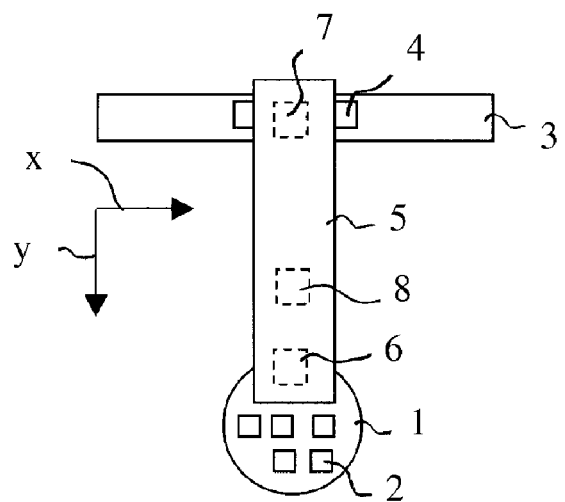
FIG. 1 shows a top view of a mounting machine for the mounting of semiconductor chips.
Figure 2:
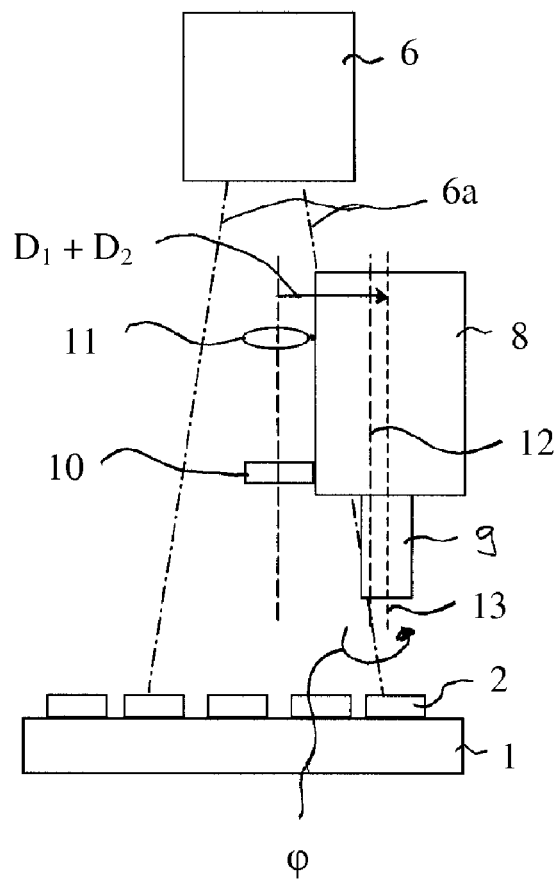
FIG. 2 shows a side view of a camera, a bonding head and a wafer table.

FIG. 1 schematically shows a top view of a mounting machine for mounting semiconductor chips, which is a so-called die bonder, insofar as necessary for the understanding of the invention. FIG. 2 shows parts of the mounting machine in a lateral view. The die bonder comprises a wafer table 1 on which the semiconductor chips 2 to be mounted are provided, a substrate table 3 on which the substrate 4 to be mounted is provided by a transport apparatus (not shown), and a pick-and-place system 5 which picks up the semiconductor chips 2 from the wafer table 1 and places the same on the substrate 4, and two cameras 6 and 7. The pick-and-place system 5 comprises a bonding head 8 with an exchangeable chip gripper 9 (FIG. 2) and two linear, position-controlled drives for moving the bonding head 8 in two orthogonal directions which are designated as the x-direction and y-direction. A third drive (not shown) is used for lifting and lowering the bonding head 8 or the chip gripper 9 in the z-direction which extends perpendicular to the drawing plane. The first camera 6 is used for determining the position of the next semiconductor chip 2 to be removed. The second camera 7 is used to determine the position of the substrate place on the substrate 4 on which the semiconductor chip 2 will be placed. The first camera 6 is usually arranged in a stationary manner. The second camera 7 is also arranged in a stationary manner or can be moved with separate drives in at least one or in two directions extending parallel to the surface of substrate 4. Such pick-and-place systems 5 are known for example from the patents U.S. Pat. Nos. 6,185,815, 7,146,718, 7,120,995 and 7,415,759.

A marking 10 (FIG. 2) is attached laterally to the bonding head 8 in such a way that it is visible in the image supplied by the first camera 6 when the bonding head 8 is situated in the visual field of the first camera 6, and is visible in the image supplied by the second camera 7 when the bonding head 8 is situated in the visual field of the second camera 7.

FIG. 2 shows a side view of the first camera 6, the bonding head 8 and the wafer table 1. Its visual field which is delimited in the drawing by lines 6a faces the wafer table 1, so that in the image as supplied by the same the next semiconductor chip 2 to be removed is imaged in a sharply defined manner. The focal plane of the first camera 6 lies in the plane defined by the semiconductor chip 2 to be removed. The focal plane of the second camera 7 (FIG. 1) lies in the plane defined by the surface of the substrate 4 to be mounted. It is not possible to attach the marking 10 on the bonding head 8 in such a way that it is imaged in a sharply defined manner by both cameras 6 and 7 without adjusting the focal plane. In order to still ensure that the marking 10 is imaged in a sharply defined manner, a lens 10 is advantageously attached to the bonding head 8 above the marking 10. The lens 11 is located between the marking 10 and the respective camera 6 and 7 and ensures that the marking 10 is imaged in sufficiently sharply defined manner in the image of the respective camera 6 and 7. In order to ensure that the marking 10 is imaged in a sharply defined manner, it could also be foreseen to adjust the focal planes of the cameras instead of providing the lens 11. The solution with the lens 11 is simpler, faster and more cost-effective, because as a result of the lens 11 a smaller adjustment range of the lens system of the cameras 6 and 7 is required.

The first camera 6 supplies its image data to a first image processing unit which determines the position and orientation of the semiconductor chip 2 to be mounted next from the image data and provides them in the form of positional data relating to a first system of coordinates $KS_1$. These positional data consist of three numbers (p, q, φ), with the two numbers p and q designating the position of a reference point of the semiconductor chip 2 and the number φ determining the angle about which the semiconductor chip 2 is rotated against its setpoint position.

The second camera 7 supplies its image data to a second image processing unit which determines the position and orientation of the substrate place from the image data on which the semiconductor chip 2 will be mounted, and provides them in the form of positional data relating to a second system of coordinates $KS_2$. These positional data consist of three numbers (u, v, ψ), with the numbers u and v designating the position of a reference point of the substrate place and the number ψ the angle about which the substrate place is rotated against its setpoint position.

The first linear drive of the pick-and-place systems supplies a number $x_M$ and the second linear drive of the pick-and-place systems supplies a number $y_M$, which together form the positional data which represent the position $(x_M, y_M)$ of the marking 10 with respect to the third system of coordinates $KS_3$.

The chip gripper 9 is rotatable about a rotational axis 12 (FIG. 2). The suction opening of chip gripper 9 defines the position of the gripper axis 13 (FIG. 2) of chip gripper 9. The position $(x_G, x_G)$ of the gripper axis 13 in the third system of coordinates $KS_3$ is given by $$(x_G, y_G) = (x_M, y_M) + D + E$$

with vector D describing the position of rotational axis 12 relative to the position $(x_M, y_M)$ of the marking 10 and vector E the position of the gripper axis 13 relative to the position of the rotational axis 12. Vector D is a fixed vector which is to be determined once. Vector E is a vector which co-rotates with the chip gripper 9: Its length has a fixed amount, but its direction changes when the chip gripper 9 is rotated about the rotational axis 12. In the ideal case, the rotational axis 12 and the gripper axis 13 always coincide, i.e. E=0, irrespective of the rotational position of the chip gripper 9.

Figure 3:
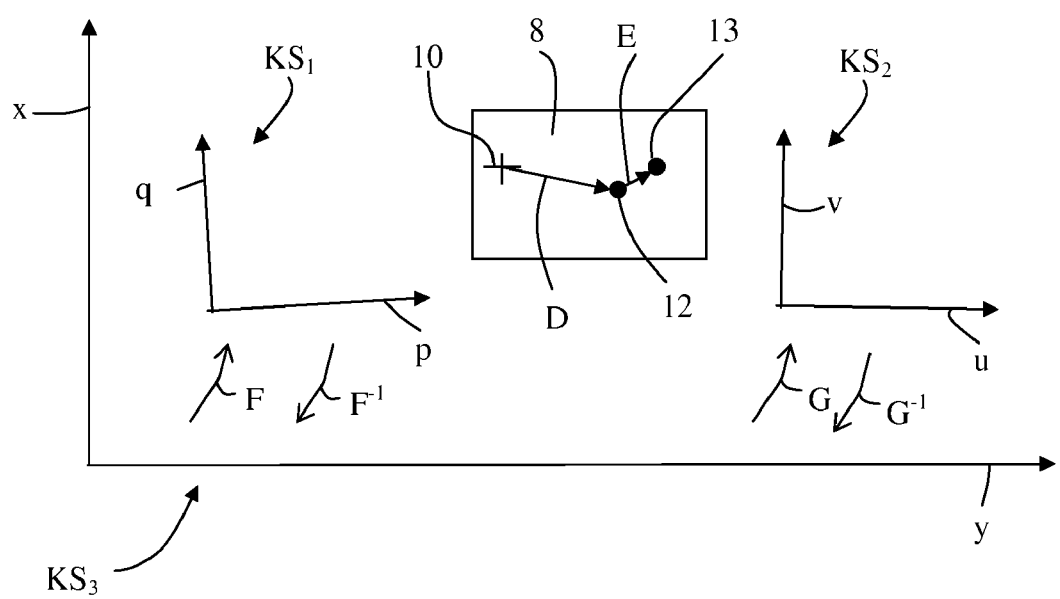
FIG. 3 shows a top view of the bonding head and three different systems of coordinates.

FIG. 3 illustrates the correlation between the three system of coordinates $KS_1$, $KS_2$ and $KS_3$. In order to ensure that the semiconductor chips 2 can be placed on the substrate 4 in a correctly positioned manner, it must be possible to calculate the current position of the gripper axis 13 of the chip gripper 9 both in the first system of coordinates $KS_1$ and in the second system of coordinates $KS_2$. A first mapping function F is therefore determined in the first-time setup or general new setting of the mounting machine, which function F maps the first system of coordinates $KS_1$ to the third system of coordinates $KS_3$. This occurs with the help of the marking 10: The two linear drives of the pick-and-place systems 5 move the bonding head 8 with the marking 10 to a number k of different positions $(x_n, y_n)$ with n=1 to k within the visual field of the first camera 6, and the first image processing unit determines from the image supplied by the first camera 6 the pertinent position $(p_n, q_n)$ of marking 10. The first mapping function F is calculated from the obtained data records. The following then applies:

$$(x, y) = F(p, q)$$

The inverse function $F^{-1}$ of the mapping function F is then calculated, so that $$(p,q)=F^{-1}(x,y)$$

Furthermore, a first correction vector $K_1$ is set to the value $K_1=0$.

In analogy to this, a second mapping function G that maps the second system of coordinates $KS_2$ to the third system of coordinates $KS_3$ and its inverse function $G^{-1}$ are determined. The following then applies:

$$(x,y)=G(u,v)$$

and vice-versa $$(u,v)=G^{-1}(x,y)$$

Furthermore, a second correction vector $K_2$ is set to the value $K_2=0$

The first camera 6 and the first system of coordinates $KS_1$ are used in order to determine the target coordinates relating to the first system of coordinates $KS_1$ to which the pick-and-place system 5 must move the bonding head 8 so that the chip gripper 9 can take up the semiconductor chip 2 provided on the wafer table 1. The second camera 7 and the second system of coordinates $KS_2$ are used in order to determine the target coordinates relating to the second system of coordinates $KS_2$ to which the pick-and-place system 5 must move the bonding head 8 so that the chip gripper 9 can place the semiconductor chip 2 in a correctly positioned manner. All calculations are performed in these two systems of coordinates $KS_1$ and $KS_2$. Only after the completion of all calculations will the determined target coordinates be converted into the coordinates of motion of the third system of coordinates $KS_3$ by means of the respective mapping function F and G. Vectors D and E are therefore determined both as vectors $D_1$ and $E_1$ relating to the first system of coordinates $KS_1$ and as vectors $D_2$ and $E_2$ relating to the second system of coordinates $KS_2$. The third system of coordinates $KS_3$ is therefore only used to move the bonding head 8 without making any calculations in this system of coordinates $KS_3$. The third system of coordinates $KS_3$ is given by the mechanics of the pick-and-place system 5, i.e. the coordinates x and y are the positional values supplied by the encoders of the two linear drives and is therefore not an exact orthogonal system of coordinates.

Once the mapping functions F and G, their inverse functions $F^{-1}$ and $G^{-1}$ and the vectors $D_1$, $E_1$, $D_2$ and $E_2$ have been determined, one semiconductor chip 2 after the other can be mounted in the production phase in that an image is taken of the next semiconductor chip 2 by first camera 6 and the positional data $(p_W, q_W, \phi_W)$ relating to first system of coordinates $KS_1$ of the semiconductor chip 2 are calculated from the image, whereby $\phi_W=0$ when the semiconductor chip 2 is not rotated against its setpoint position;

the position $(x_W, y_W)$ relating to the third system of coordinates $KS_3$ which needs to be taken by the marking 10 so that the gripper axis 13 of the chip gripper 9 passes through the reference point of the semiconductor chip 2 is calculated as $$(x_W,y_W)=F[(p_W,q_W)-D_1-E_1+K_1]$$

the calculated position $(x_W, y_W)$ is approached and the semiconductor chip 2 is taken up by the chip gripper 9;

an image of the substrate place is taken by the second camera 7 on which the semiconductor chip 2 will be mounted, and the positional data $(u_S, v_S, \psi_S)$ of the substrate place relating to the second system of coordinates $KS_2$ are calculated from the image, whereby $\psi_S=0$ when the substrate place is not rotated against its setpoint position;

the position $(x_S, y_S)$ relating to the third system of coordinates $KS_3$ which needs to be taken by the marking 10 so that the gripping axis 13 of the chip gripper 9 passes through the reference point of the substrate place is calculated as $$(x_S,y_S)=G[(u_S,v_S)-D_2-E_2+K_2]$$

the calculated position $(x_S, y_S)$ is approached, the chip gripper 9 is optionally rotated about the angle $\psi_S-\phi_S$, and the semiconductor chip 2 is placed on the substrate place.

In order to keep the placement precision of the die bonder at the same high level during the entire production, a readjustment of the first correction vector $K_1$ and the second correction vector $K_2$ is performed during the occurrence of a predetermined event. The marking 10 provided on the bonding head 8 is used, which marking is brought into the visual field of the first camera 6 for readjusting the first correction vector $K_1$ and into the visual field of the second camera 7 for readjusting the second correction vector $K_2$. The readjustment of the first correction vector $K_1$ occurs by:

Moving the bonding head 8 to a setpoint position $R=(x_R, y_R)$ in which the marking 10 is located in the visual field of the first camera 6, with the coordinates $(x_R, y_R)$ relating to the third system of coordinates $KS_3$;

calculating the setpoint position $(p_R, q_R)$ of the marking 10 with respect to the first system of coordinates $KS_1$ as $(p_R, q_R)=F(x_R, y_R)$;

taking an image of the marking 10 with the first camera 6, using the image of the first camera 6 for determining the actual position $(p_M, q_M)$ of the marking 10 with respect to the first system of coordinates $KS_1$, and calculating the first correction vector $K_1$ as difference between the approached setpoint position and the measured actual position:

$$K_1=(p_R,q_R)-(p_M,q_M).$$

It is clear that the first correction vector $K_1$ relates to the first system of coordinates $KS_1$.

The readjustment of the second correction vector $K_2$ occurs analogously by moving the bonding head 8 to a setpoint position $T=(x_T, y_T)$ in which the marking 10 is located in the visual field of the second camera 7, with the coordinates $(x_T, y_T)$ relating to the third system of coordinates $KS_3$;

calculating the setpoint position $(u_T, v_T)$ of the marking 10 with respect to the second system of coordinates $KS_2$ into $(u_T, v_T)=G^{-1}(x_T, y_T)$;

taking an image of the marking 10 with the second camera 7, using the image of the camera 7 for determining the actual position $(u_M, v_M)$ of the marking 10 with respect to the second system of coordinates $KS_2$, and calculating the second correction vector $K_2$ as difference between the approached setpoint position and the measured actual position:

$$K_2=(u_T,v_T)-(u_M,v_M),$$

It is clear that the second correction vector $K_2$ relates to the second system of coordinates $KS_2$.

There are different events that can trigger a readjustment of the correction vectors $K_1$ and $K_2$, especially the following four events:

since the last calibration a predetermined number of semiconductor chips 2 have been mounted;

since the last calibration a temperature measured at a predetermined location of the pick-and-place systems 5 has changed by more than a predetermined value;

production was stopped;

the actual position of the mounted semiconductor chip which was detected and calculated by the second camera 7 after mounting deviates from the setpoint position by more than a predetermined amount.

After the completion of the readjustment of the correction vectors $K_1$ and $K_2$, the mounting of the semiconductor chips 2 can be continued according to the steps as described above, but the updated correction vectors $K_1$ and $K_2$ can now differ from zero.

The invention can be applied in the known pick-and-place systems in which the wafer table 1 and the platform 3 for the substrates 4 are arranged in parallel planes, as well as in the pick-and-place system as described in EP 1480507 in which the wafer table 1 and the platform 3 for the substrates are arranged in an oblique manner relative to each other and in which the bonding head 8 performs a pivoting movement about a horizontal axis in addition to the movement in the x-direction and y-direction.

Although it is preferred to determine the mapping functions F and G in the manner described above with the use of the marking 10 provided on the bonding head 2, it is nevertheless possible to determine the mapping functions F and G with the use of a conventional calibration plate.

The embodiment as described above is a preferred embodiment, in which the bonding head is moved for adjustment and readjustment to the first setpoint position R and to the second setpoint position T, respectively, and the coordinates of the first setpoint position R and the second setpoint position T relating to the third system of coordinates $KS_3$ are stored and are used for readjusting the two correction vectors $K_1$ and $K_2$. In this example, the respective setpoint position of the marking 10 is calculated by means of the inverse function $F^{-1}$ and $G^{-1}$, respectively. A further embodiment is explained below in which the coordinates of the marking 10 (or any other random reference point on the bonding head 8) relating to the first system of coordinates $KS_1$ or the coordinates of the marking 10 (or any other random reference point on the bonding head 8) relating to the second system of coordinates $KS_2$ are stored additionally when the bonding head 8 is located in the first or second setpoint position, and are then used for readjustment of the two corrections vectors $K_1$ and $K_2$.

The pick-and-place system comprises as a part the pick system for picking up the semiconductor chips from the wafer table. The third system of coordinates $KS_3$ is a coordinate system immanent to the pick system or the pick-and-place system and will therefore be referred to below as system of coordinates KS. To ensure that the readjustment can be performed, an adjustment is performed at first in a setup phase in which the bonding head 8 is moved to a first setpoint position which is located in the visual field of first camera 6 and the coordinates $(x_{SP1}, y_{SP1})$ of the first setpoint position relating to the system of coordinates KS and the coordinates $(p_{SP1}, q_{SP1})$ of the first setpoint position relating to the system of coordinates $KS_1$ of the first camera 6 are determined and stored. The readjustment occurs in the production phase in such a way that the bonding head 8 is moved to the coordinates $(x_{SP1}, y_{SP1})$ of the first setpoint position and the coordinates $(p_{SP1}', q_{SP1}')$ of the setpoint position relating to the system of coordinates $KS_1$ of the first camera 6 are determined again. The difference vector $(p_{SP1}', q_{SP1}')-(p_{SP1}, q_{SP1})$ contains the information about the displacement of the first system of coordinates $KS_1$ with respect to the system of coordinates KS which has occurred since the setup in the setup phase. Any random reference point on the bonding head 8 can be used for defining the first setpoint position of the bonding head 8 with respect to the first system of coordinates $KS_1$. The above mentioned marking 10 is preferably used for the definition of the reference point.

In an analogous manner, displacements of the second system of coordinates $KS_2$ of the second camera 7 are detected and corrected with respect to the system of coordinates KS of the bonding head 8, such that in the setup phase a further adjustment is performed in which the bonding head 8 is moved to a second setpoint position which is located in the visual field of the second camera 7 and the coordinates $(x_{SP2}, y_{SP2})$ of the second setpoint position relating to the system of coordinates KS and the coordinates $(u_{SP2}, v_{SP2})$ of the second setpoint position relating to the system of coordinates $KS_2$ of the second camera 7 are determined and stored. The readjustment in the production phase occurs in such a way that the bonding head 8 is moved to the coordinates $(x_{SP2}, y_{SP2})$ of the second setpoint position and the coordinates $(u_{SP2}', v_{SP2}')$ of the second setpoint position which relate to the system of coordinates $KS_2$ of the second camera 7 are determined again. The difference vector $(u_{SP2}', v_{SP2}')-(u_{SP2}, v_{SP2})$ contains the information about the displacement of the second system of coordinates $KS_2$ with respect to the system of coordinates KS which has occurred since the setup in the setup phase. In this case too, any random reference point on the bonding head 8 can be used for the definition of the second setpoint position of the bonding head 8 with respect to the second system of coordinates $KS_2$. The marking 10 as mentioned above is preferably used for the definition of the reference point.

The determination of the coordinates of the reference points relating to the first system of coordinates $KS_1$ and the second system of coordinates $KS_2$ comprises the taking of an image with the respective camera 6 and 7 and the determination of the coordinates of the reference point by means of conventional image evaluation. The position of the semiconductor chip 2 to be mounted next, as detected by the first camera 6, is therefore provided in the form of positional data relating to the first system of coordinates $KS_1$ and the position of the substrate place on which semiconductor chip 2 is to be mounted, as detected by the second camera 7, is provided in the form of positional data relating to the second system of coordinates $KS_2$.

The mounting of the semiconductor chips then preferably comprises in the setup phase:

determining a first mapping function which maps the first system of coordinates $KS_1$ to the system of coordinates KS and its inverse function, setting a first correction vector to the value zero, determining a second mapping function which maps the second system of coordinates $KS_2$ to the coordinate system KS and its inverse function, and setting a second correction vector to the value zero; and in the production phase:

one semiconductor chip 2 after another is mounted, including the steps taking with the first camera 6 an image of the semiconductor chip 2 to be mounted next, determining from the image the position of the semiconductor chip 2 with respect to the first system of coordinates $KS_1$, calculating the position, to which the pick-and-place system 5 needs to move the bonding head 8 in order to pick up the semiconductor chip 2, in relation to the system of coordinates KS by means of the first mapping function and by taking into account the first correction vector;

taking with the second camera 7 an image of the substrate place on which the semiconductor chip 2 is to be mounted, determining from the image the position of the substrate place with respect to the second system of coordinates $KS_2$, and calculating the position, to which the pick-and-place system 5 needs to move the bonding head 8 in order to mount the semiconductor chip 2 on the substrate place, in relation to the system of coordinates KS by means of the second mapping function and by taking into account the second correction vector;

wherein the readjustment in the production phase comprises a readjustment of the first and second correction vector with the following steps:

moving the bonding head 8 to the first setpoint position;

taking with the first camera 6 an image of the marking 10, determining from the image of the first camera 6 the actual position of the marking 10 with respect to the first system of coordinates $KS_1$, calculating the first correction vector $K_1$ as difference between the stored or calculated setpoint position and the determined actual position;

moving the bonding head 8 to the second setpoint position;

taking with the second camera 7 an image of the marking 10, determining from the image of the second camera 7 the actual position of the marking 10 with respect to the second system of coordinates $KS_2$, and calculating the second correction vector as difference between the stored or calculated setpoint position and the determined actual position.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A method for picking up semiconductor chips provided on a wafer table, in which a first camera detects the position of a provided semiconductor chip and a chip gripper held on a bonding head picks up the semiconductor chip, with the bonding head with the chip gripper being movable by means of a pick system according to a system of coordinates KS immanent to the pick system, the method comprising in a setup phase performing an adjustment of a first setpoint position of the bonding head, said first setpoint position located in the visual field of the first camera, the adjustment including moving the bonding head to the first setpoint position, and determining and storing the coordinates of the first setpoint position relating to the system of coordinates KS and the coordinates of the first setpoint position relating to a system of coordinates $KS_1$ of the first camera, and in a production phase performing a readjustment of the first setpoint position at the occurrence of a predetermined event.

2. The method of claim 1, wherein the bonding head is provided with a marking and the coordinates of the first setpoint position relating to the system of coordinates $KS_1$ of the first camera represent the position of the marking.

3. The method of claim 1, further comprising mounting the semiconductor chips on a substrate, wherein the pick system is part of a pick-and-place system which enables picking up the semiconductor chip from the wafer table and mounting the semiconductor chip on the substrate and wherein a second camera detects the position of a substrate place on which the semiconductor chip picked up by the chip gripper is to be mounted, the method comprising in the setup phase performing an adjustment of a second setpoint position of the bonding head, said second setpoint position located in the visual field of the second camera, the adjustment including moving the bonding head to the second setpoint position, and determining and storing the coordinates of the second setpoint position relating to the system of coordinates KS and the coordinates of the second setpoint position relating to the system of coordinates $KS_2$ of the second camera, and in the production phase performing a readjustment of the second setpoint position at the occurrence of a predetermined event.

4. The method of claim 1, wherein the event includes at least one of the following events:

since the last calibration a predetermined number of semiconductor chips have been mounted;

since the last calibration a temperature measured at a predetermined location of the pick-and-place system has changed by more than a predetermined value;

production was stopped;

the actual position of the mounted semiconductor chip which was detected and calculated by the second camera after mounting deviates from the setpoint position by more than a predetermined amount.

5. The method of claim 2, wherein the event includes at least one of the following events:

since the last calibration a predetermined number of semiconductor chips have been mounted;

since the last calibration a temperature measured at a predetermined location of the pick-and-place system has changed by more than a predetermined value;

production was stopped;

the actual position of the mounted semiconductor chip which was detected and calculated by the second camera after mounting deviates from the setpoint position by more than a predetermined amount.

6. The method of claim 3, wherein the bonding head is provided with a marking and the coordinates of the first setpoint position relating to the system of coordinates $KS_1$ of the first camera represent the position of the marking and the coordinates of the second setpoint position relating to the system of coordinates $KS_2$ of the second camera represent the position of the marking.

7. The method of claim 3, wherein the bonding head is provided with a marking, the method further comprising in the setup phase:

determining a first mapping function which maps the first system of coordinates $KS_1$ to the system of coordinates KS and its inverse function, setting a first correction vector to the value zero, determining a second mapping function which maps the second system of coordinates $KS_2$ to the coordinate system KS and its inverse function, and setting a second correction vector to the value zero; and in the production phase:

mounting one semiconductor chip after the other including taking with the first camera an image of the semiconductor chip to be mounted next,
determining from the image the position of the semiconductor chip with respect to the first system of coordinates $KS_1$,
calculating the position, to which the pick-and-place system needs to move the bonding head in order to pick up the semiconductor chip, in relation to the system of coordinates KS by means of the first mapping function and by taking into account the first correction vector;
taking with the second camera an image of the substrate place on which the semiconductor chip is to be mounted,
determining from the image the position of the substrate place with respect to the second system of coordinates $KS_2$, and
calculating the position, to which the pick-and-place system needs to move the bonding head in order to mount the semiconductor chip on the substrate place, in relation to the system of coordinates KS by means of the second mapping function and by taking into account the second correction vector;
wherein the readjustment in the production phase comprises a readjustment of the first and second correction vector with the following steps:
moving the bonding head to the first setpoint position;
taking with the first camera an image of the marking,
determining from the image of the first camera the actual position of the marking with respect to the first system of coordinates $KS_1$,
calculating the first correction vector $K_1$ as difference between the stored or calculated setpoint position and the determined actual position;
moving the bonding head to the second setpoint position;
taking with the second camera an image of the marking,
determining from the image of the second camera the actual position of the marking with respect to the second system of coordinates $KS_2$, and
calculating the second correction vector as difference between the stored or calculated setpoint position and the determined actual position.

8. The method of claim 3, wherein the event includes at least one of the following events:
since the last calibration a predetermined number of semiconductor chips have been mounted;
since the last calibration a temperature measured at a predetermined location of the pick-and-place system has changed by more than a predetermined value;
production was stopped;
the actual position of the mounted semiconductor chip which was detected and calculated by the second camera after mounting deviates from the setpoint position by more than a predetermined amount.

9. The method of claim 5, the method further comprising imaging the marking applied to the bonding head with sufficient sharpness onto the respective camera by means of a lens attached to the bonding head.

10. The method of claim 6, the method further comprising in the setup phase:
determining a first mapping function which maps the first system of coordinates $KS_1$ to the system of coordinates KS and its inverse function,
setting a first correction vector to the value zero,
determining a second mapping function which maps the second system of coordinates $KS_2$ to the coordinate system KS and its inverse function, and
setting a second correction vector to the value zero; and
in the production phase:
mounting one semiconductor chip after the other including
taking with the first camera an image of the semiconductor chip to be mounted next,
determining from the image the position of the semiconductor chip with respect to the first system of coordinates $KS_1$,
calculating the position, to which the pick-and-place system needs to move the bonding head in order to pick up the semiconductor chip, in relation to the system of coordinates KS by means of the first mapping function and by taking into account the first correction vector;
taking with the second camera an image of the substrate place on which the semiconductor chip is to be mounted,
determining from the image the position of the substrate place with respect to the second system of coordinates $KS_2$, and
calculating the position, to which the pick-and-place system needs to move the bonding head in order to mount the semiconductor chip on the substrate place, in relation to the system of coordinates KS by means of the second mapping function and by taking into account the second correction vector;
wherein the readjustment in the production phase comprises a readjustment of the first and second correction vector with the following steps:
moving the bonding head to the first setpoint position;
taking with the first camera an image of the marking,
determining from the image of the first camera the actual position of the marking with respect to the first system of coordinates $KS_1$,
calculating the first correction vector $K_1$ as difference between the stored or calculated setpoint position and the determined actual position;
moving the bonding head to the second setpoint position;
taking with the second camera an image of the marking,
determining from the image of the second camera the actual position of the marking with respect to the second system of coordinates $KS_2$, and
calculating the second correction vector as difference between the stored or calculated setpoint position and the determined actual position.

11. The method of claim 6, wherein the event includes at least one of the following events:
since the last calibration a predetermined number of semiconductor chips have been mounted;
since the last calibration a temperature measured at a predetermined location of the pick-and-place system has changed by more than a predetermined value;
production was stopped;
the actual position of the mounted semiconductor chip which was detected and calculated by the second camera after mounting deviates from the setpoint position by more than a predetermined amount.

12. The method of claim 6, the method further comprising imaging the marking applied to the bonding head with sufficient sharpness onto the respective camera by means of a lens attached to the bonding head.

13. The method of claim 7, wherein the event includes at least one of the following events:
- since the last calibration a predetermined number of semiconductor chips have been mounted;
- since the last calibration a temperature measured at a predetermined location of the pick-and-place system has changed by more than a predetermined value;
- production was stopped;
- the actual position of the mounted semiconductor chip which was detected and calculated by the second camera after mounting deviates from the setpoint position by more than a predetermined amount.

14. The method of claim 7, the method further comprising imaging the marking applied to the bonding head with sufficient sharpness onto the respective camera by means of a lens attached to the bonding head.

15. The method of claim 10, wherein the event includes at least one of the following events:
- since the last calibration a predetermined number of semiconductor chips have been mounted;
- since the last calibration a temperature measured at a predetermined location of the pick-and-place system has changed by more than a predetermined value;
- production was stopped;
- the actual position of the mounted semiconductor chip which was detected and calculated by the second camera after mounting deviates from the setpoint position by more than a predetermined amount.

16. The method of claim 10, the method further comprising imaging the marking applied to the bonding head with sufficient sharpness onto the respective camera by means of a lens attached to the bonding head.

17. The method of claim 11, the method further comprising imaging the marking applied to the bonding head with sufficient sharpness onto the respective camera by means of a lens attached to the bonding head.

* * * * *